United States Patent
Landis

(10) Patent No.: US 8,778,195 B2
(45) Date of Patent: Jul. 15, 2014

(54) METHOD TO FABRICATE A MOULD FOR LITHOGRAPHY BY NANO-IMPRINTING

(75) Inventor: Stéfan Landis, Voiron (FR)

(73) Assignee: Commissariat a l' Energie Atomique, Paris (FR)

( * ) Notice: Subject to any disclaimer, the term of this patent is extended or adjusted under 35 U.S.C. 154(b) by 455 days.

(21) Appl. No.: 12/715,801

(22) Filed: Mar. 2, 2010

(65) Prior Publication Data

US 2010/0227018 A1  Sep. 9, 2010

(30) Foreign Application Priority Data

Mar. 3, 2009  (FR) ...................................... 09 51335

(51) Int. Cl.
*B44C 1/22* (2006.01)
*B82Y 40/00* (2011.01)

(52) U.S. Cl.
USPC ................... 216/11; 216/38; 216/39; 216/72; 216/88; 216/95; 977/887; 977/888; 977/890

(58) Field of Classification Search
None
See application file for complete search history.

(56) References Cited

U.S. PATENT DOCUMENTS

| | | | |
|---|---|---|---|
| 6,294,450 B1 | 9/2001 | Chen et al. | |
| 6,399,502 B1 | 6/2002 | Hernandez et al. | |
| 6,407,443 B2 | 6/2002 | Chen et al. | |
| 6,544,863 B1 | 4/2003 | Chong et al. | |
| 6,743,368 B2 * | 6/2004 | Lee .................................. | 216/2 |
| 6,759,180 B2 | 7/2004 | Lee | |
| 7,141,866 B1 * | 11/2006 | Islam et al. .................... | 257/628 |
| 7,256,435 B1 | 8/2007 | Kornilovich et al. | |
| 7,803,712 B2 * | 9/2010 | Kornilovich et al. ......... | 438/691 |
| 7,906,031 B2 * | 3/2011 | Cheng et al. .................... | 216/41 |
| 8,183,138 B2 * | 5/2012 | Subramanian et al. ........ | 438/584 |
| 8,404,600 B2 * | 3/2013 | Sandhu ......................... | 438/763 |
| 2002/0075554 A1 | 6/2002 | Brophy et al. | |
| 2006/0021967 A1 | 2/2006 | Lee | |

(Continued)

FOREIGN PATENT DOCUMENTS

| | | |
|---|---|---|
| EP | 1 041 639 A1 | 10/2000 |
| EP | 1 333 324 A2 | 8/2003 |

(Continued)

OTHER PUBLICATIONS

F. Carcenac, et al., "Fabrication of high density nanostructures gratings (>500Gbit/in$^2$) used as molds for nanoimprint lithography", Microelectronic Engineering vol. 53, 2000, pp. 163-166.

(Continued)

*Primary Examiner* — Anita Alanko
(74) *Attorney, Agent, or Firm* — Oblon, Spivak, McClelland, Maier & Neustadt, L.L.P.

(57) ABSTRACT

A method to fabricate an imprint mould in three dimensions including at least: a) forming at least one trench, of width W and depth h, in a substrate, thereby forming three surfaces including, a bottom of the at least one trench, sidewalls of the at least one trench, and a remaining surface of the substrate, called top of the substrate; b) forming alternate layers in the at least one trench, each having at least one portion perpendicular to the substrate, in a first material and in a second material which can be selectively etched relative to the first material; and c) selectively etching said portions of the layers perpendicular to the substrate.

14 Claims, 18 Drawing Sheets

(56) References Cited

U.S. PATENT DOCUMENTS

| | | |
|---|---|---|
| 2006/0063387 A1 | 3/2006 | Miller et al. |
| 2006/0186084 A1* | 8/2006 | Wang et al. ............... 216/11 |
| 2006/0198919 A1 | 9/2006 | Tong |
| 2007/0049028 A1* | 3/2007 | Subramanian et al. ....... 438/689 |
| 2008/0028953 A1* | 2/2008 | Ando et al. ............... 101/32 |
| 2008/0268351 A1 | 10/2008 | Landis et al. |

FOREIGN PATENT DOCUMENTS

| | | | |
|---|---|---|---|
| FR | 2 893 018 | | 5/2007 |
| JP | 2000231011 A | * | 8/2000 |
| JP | 2003-324066 | | 11/2003 |
| JP | 2004-006643 | | 1/2004 |
| JP | 2004-363584 | | 12/2004 |
| JP | 2005-519711 | | 7/2005 |
| JP | 2008-44329 | | 2/2008 |
| WO | WO 2004/022478 A1 | | 3/2004 |
| WO | WO 2005/121019 A1 | | 12/2005 |
| WO | WO 2007/030527 A2 | | 3/2007 |
| WO | WO 2008/138361 A1 | | 11/2008 |

OTHER PUBLICATIONS

Gun-Young Jung, et al., "Circuit Fabrication at 17 nm Half-Pitch by Nanoimprint Lithography", Nano Letters, vol. 6, No. 3. 2006, pp. 351-354, published on web Feb. 4, 2006.

G.Y. Jung, et al., "Fabrication of a 34×34 Crossbar Structure at 50 nm Half-pitch by UV-based Nanoimprint Lithography", Nano Letters, vol. 4, No. 7, 2004, pp. 1225-1229, published on web Jun. 3, 2004.

Yong Chen, et al., "Nanoscale molecular-switch crossbar circuits", Nanotechnology, vol. 14, 2003, pp. 462-468, Mar. 20, 2003.

Office Action mailed Jan. 7, 2014, in Japanese Patent Application No. 2010-046387 (with English-language Translation).

* cited by examiner

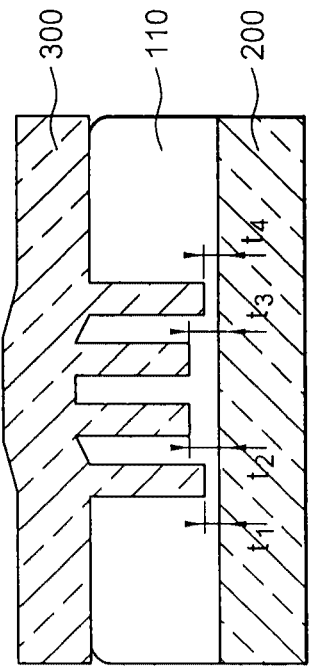
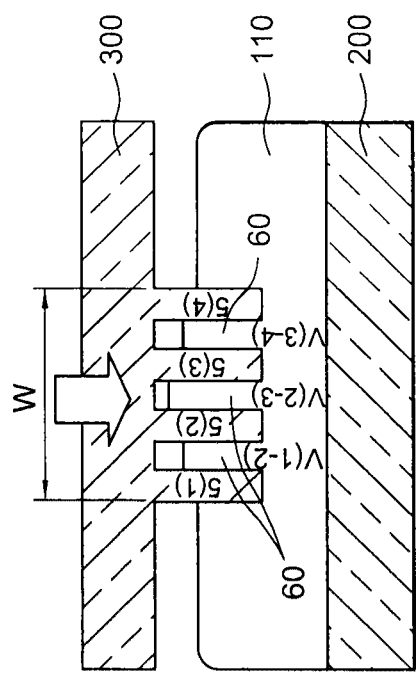
FIG. 6B
FIG. 6B'

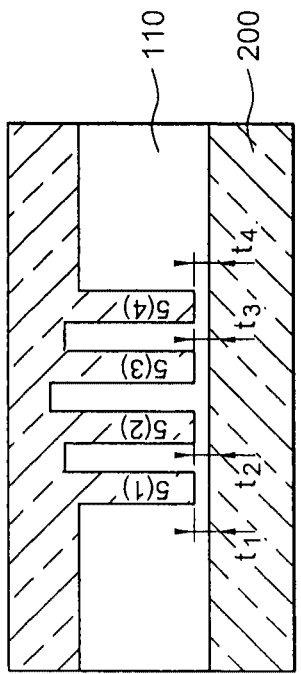
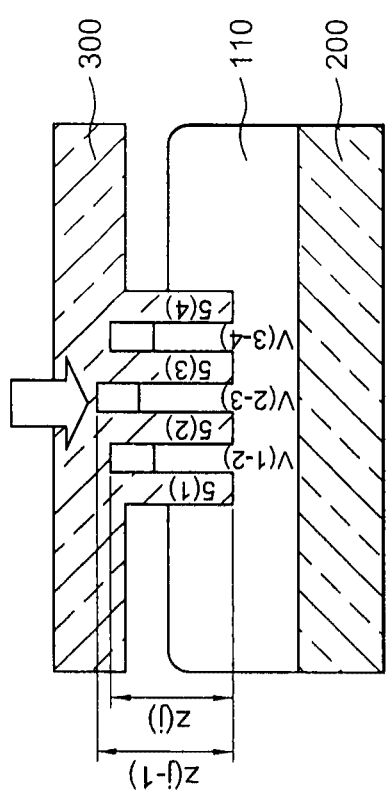
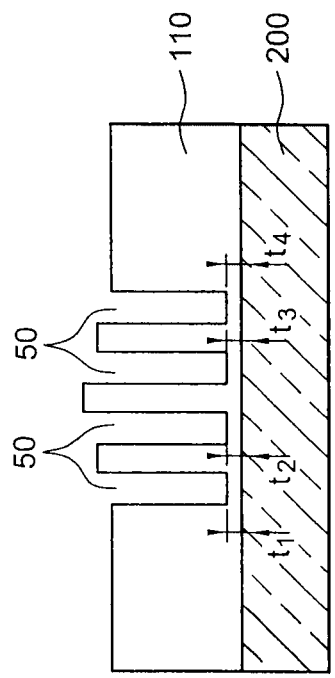
FIG. 6C'
FIG. 6C
FIG. 6D

METHOD TO FABRICATE A MOULD FOR LITHOGRAPHY BY NANO-IMPRINTING

TECHNICAL AREA AND STATE OF THE ART

The invention concerns the so-called area of nano-imprinting, a lithography technique used to produce an imprint of positive type by pressing a mould comprising negative-type patterns, possibly having micrometric and/or nanometric dimensions, into a layer of resin deposited on a substrate to be structured.

It is therefore possible to obtain patterns having a width of a few nanometers to several microns, in a resin or polymer, and then to transfer them to a substrate.

With this technique it is possible to form numerous structures rapidly, economically and reliably from one mould: use of a single mould only requires a single implementation of techniques which are costly as regards time and/or money and which alone can be used to obtain structures having the desired nanometric resolutions.

Two approaches are currently possible to conduct lithography by nano-imprinting:
- thermal imprinting which consists of heating a polymer beyond its glass transition temperature, and of shaping it with a mould generally in silicon or nickel.
- UV-assisted imprinting. In this case a transparent mould e.g. in quartz is pressed into a monomer or pre-polymer cross-linked by UV exposure while the mould is applied. This technique is currently undergoing major development since it is possible to align different imprinted levels with a transparent mould.

The fabrication of the moulds is a critical step since the resolution, lifetime of the mould, nano-imprinting and nano-moulding production rate and profitability largely depend on the quality and cost of the mould used.

The patterns to be printed, in relief on the surface of a mould are obtained:
- either by electronic lithography and reactive ionic etching,
- or by duplication of another prefabricated mould (master).

With electronic lithography it is possible to obtain a mould with an electron beam focused on a layer of resin sensitive to electrons. The physicochemical properties of the resin can then be selectively modified. This beam is piloted by an electromagnetic field on a field of limited insulation. Therefore any type of shape can be created. By mechanically moving the sample from one field to another with high precision, patterns covering a large surface or a whole wafer can be drawn.

Having regard to the performance levels of electronic lithography systems, to the electron-resin/substrate interaction and the properties of the resin used, the minimum size which can be obtained is typically 20 to 50 nm for dense patterns (arrays of lines or pads or spaces) and can reach 6 to 10 nm for so-called isolated patterns e.g. lines. To define structures of even smaller size, a beam of electrons of greater energy can be used as described by F. Carcenac et al. in Microelectron. Eng. 53, p. 163 (2000).

The electronic lithography method e.g. of the so-called "e-beam" type is generally used to fabricate moulds with very high resolution. Optical lithography methods (193 nm immersion lithography) do not permit patterns with a resolution of less than 30 nm to be obtained.

While electronic lithography allows very high resolutions to be achieved, it does have some major limitations:
- The write speed of the resin (and hence the speed and cost of fabrication of the nano-imprint mask) by an electronic beam is usually limited to a few $10^{-4}$ cm$^2$/s for writing with equipment capable of reaching the highest resolutions (less than 10 nm) and in the order of a few cm$^2$/s for multibeam, shaped beam or projection technologies (but resolution is then limited to 30 nm).
- The resolution which can be achieved for shapes of any kind is conventionally more than 20 nm. Resolutions of less than 10 nm are generally only achieved with very simple ultimate lithography of isolated lines or pads or which have little density i.e. with a separation distance from nearest adjacent neighbours that is nearly 3 to 4 times greater (even more) than the size of the pattern itself.
- The high cost of said electronic lithography method. The equipment needed to conduct this ultimate lithography is very complex and very costly. Also, since the writing speeds are at least 2 to 3 times slower than in optic lithography, this means that the cost to produce a high resolution mould with a large active surface (largely more than several cm2) is then excessively high. Yet a nano-imprinting mould is all the more advantageous the greater its surface.
- Patterns of ultimate type (<10 nm) thus formed have 2D-type geometry. Electronic lithography permits both defining of 2D patterns, each pattern having the same depth using so-called threshold resins, or of 3D type (with variable depth depending on patterns) using so-called greyscale resins. Nevertheless it is not possible at the present time to combine the ultimate resolution capacities of electronic lithography with its capability to form patterns of 3D type.

The purpose of the present invention is therefore to propose a technical solution to all these limitations.

One particular purpose of the invention is to produce 3-dimension moulds without however using a sequence of lithography-etching steps as required by conventional methods to produce a mould having several altitudes (this term being used in the meaning of heights and/or depths).

DISCLOSURE OF THE INVENTION

The invention firstly concerns a method to fabricate an imprint mould in three dimensions, comprising at least:

a) the forming of at least one trench, for example by optic photolithography, of width W and depth h, in a substrate, b) forming alternate layers in these trenches, for example conforming layers deposited following the profile of the trenches, at least partly perpendicular to the substrate, in a first material and a second material which can be selectively etched relative to the first material, c) selectively etching said layers, forming a topology comprising at least:
- first patterns whose top lies at a first level relative to a surface of the substrate located either side of said topology, these first patterns being in a first material,
- and second patterns, for example nano-trenches, alternating with the first patterns, having at least one second level relative to said surface of the substrate, different from and lower than the first level, these second patterns being in a second material.

This method allows a nano-imprint mould to be obtained. With this mould dense arrays of lines can be made, imprinted in a material such as a resin for example, these lines following the contours defined by the trenches.

The alternating layers can be deposited in trenches so that all the deposited layers comprise at least two symmetrical parts relative to a plane passing through the middle of the trenches and perpendicular to the plane of the substrate and to the bottom of the trenches.

In one method according to the invention, the alternate layers can be formed by epitaxy.

If selective etching also allows the etching of at least part of the substrate, either side of the topology, then the first patterns protrude relative to the surface of the substrate. For example the second material is preferably etched at the same speed as the substrate. This second material can also be identical to that of the substrate.

As a variant, if the etching preferably etches the second material, the top of the first patterns, after selective etching, has a level substantially equal to the level of the surface of the substrate.

As another variant, the method comprises:
before step c), anisotropic etching of the first and second type of material, which makes it possible to bring the two levels of the first and second materials to a lower level than the level of the top of the substrate,
then, selective etching of the second material, the top of the first patterns, after selective etching, lying at a level below the level of the surface of the substrate.

Step b) may comprise the formation, in the trenches, of alternate layers solely perpendicular to the substrate and to the bottom of the trenches.

A material limiting or inhibiting the deposit of alternate conforming layers parallel to the bottom of the trenches can be present at the bottom of the trenches. This may an oxide for example. The alternate layers made in the trenches, after optional surface polishing, are solely perpendicular to the surface of the bottom of the trenches.

In one method according to the invention the substrate may be of SOI type; an optional layer of material limiting or inhibiting the deposit of the alternate layers, present in the bottom of the trenches, can then be obtained by etching the surface layer of the SOI semiconductor material as far as the buried layer of insulator material.

Alternatively the layer(s) of material limiting or inhibiting the deposit of alternate conforming layers may also be formed by deposit.

According to one variant, the material limiting or inhibiting the deposit of alternate conforming layers can also be present on the top of the substrate (it is then obtained by deposit or growth for example) before the depositing of the alternate layers, and removed after depositing of the alternate layers. The alternate layers are then only formed in the trenches and are solely deposited perpendicular to the surface of the bottom of the trenches.

The forming of the material, limiting or inhibiting the deposit of alternate layers on the bottom of the trenches and the top of the substrate, may comprise the depositing of a layer of so-called "spacer" material.

For example this "spacer" material is deposited on the assembly consisting of the top of the substrate, the sidewalls and bottoms of the trenches, and is then etched anistropically so as only to leave spacer material only following or along the sidewalls of the trenches.

Finally, the layer limiting or inhibiting the deposit may be formed by deposit or reaction on the bottom of the trenches and the top of the substrate.

Step b) may comprise the formation, in the trenches, of alternate layers partly perpendicular to the substrate and to the bottom of the trenches, and partly parallel to the surface of the bottom of the trenches.

The part of the alternate layers that is parallel to the surface of the bottom of the trenches may join together two portions of the alternate layers arranged in the trench and perpendicular to the surface of the bottom of the trenches.

Part of the alternate layers can be formed on the tops of the substrate, these then being deposited at least following the sidewalls of the trenches and around each trench, on top of the substrate, thinning being subsequently performed on the top of the substrate by chemical or mechanical technique (polishing) or by chemical mechanical polishing so as to expose the top of the substrate.

In one method of the invention, if some trenches are not fully filled with alternate layers, it is also possible, before optional polishing of the free surface, to carry out the depositing of a layer of filler material. This filler material is advantageously of the same type as at least one of the types of materials used for the alternate layers, it is preferably different from the material of the last layer deposited. The filler material then fills those parts of the trenches not filled by the layers, which restores partial planarity.

The filler material can also be deposited on the top of the substrate or on the alternate layers present on the top of the substrate, the exposing of the field of the substrate being made by thinning e.g. using a chemical or mechanical technique (polishing) or chemical mechanical polishing.

Advantageously the filler material can be selectively etched relative to the last deposited alternate layer.

The number of alternate deposited layers can be such that:
the last layer deposited can be etched selectively relative to the substrate,
the filler material is in the same material as the substrate.

The selective etching used in the frame of the invention can be partial etching of the second material, the bottom of the second patterns then consisting of the second material, preferably etched relative to the first.

The invention further concerns a device forming an imprint mould in three dimensions and comprising at least:
a substrate, comprising at least one alternation of layers having at least one part perpendicular to the plane of the substrate, in a first material and in at least one second material which can be etched selectively relative to the first material,
a surface topology comprising at least:
a) first patterns whose top lies at a first level relative to a surface of the substrate, located either side of said topology, these first patterns being in a first material,
b) and second patterns, for example trenches or nano-trenches, whose tops lies at a second level relative to said surface of the substrate, different from and lower than the first level, and these second patterns being in a second material.

The first patterns may protrude relative to said surface of the substrate and may be in a material different from the material of the substrate.

The first level can be substantially close to said surface of the substrate.

The first level can be lower than said surface of the substrate.

In one method or device according to the invention, according to one particular embodiment, the second patterns are in a material whose etch speed varies from one second pattern to another second pattern. After etching, this leads to the formation of second patterns having at least two different levels or to second patterns, for example nano-trenches, whose depth or level vary in the trench in which they are made.

For example the second material forming the alternate layers can have a variation in composition, in particular in stoichiometry. For example, at least two uneven layers differ in composition from each other, although derived from the same composition. These layers of different composition then have different etch speeds which, after etching, lead to forming patterns with as many levels as there are different compositions used in the alternate layers.

The differences in etch speed between two different alternate layers are preferably such that the variations in levels of the second patterns (or depths of the nano-trenches) separating two first patterns, are optimized to reduce residual thickness non-homogeneities of imprint material present between a substrate to be lithographed and the nano-imprint mould according to the invention, when this mould is in use.

For example, the first material is Si, the second material is $SiGe_x$ (x>15%), and two layers of second material have compositions $SiGe_{x1}$ and $SiGe_{x2}$, with $x1 \neq x2$ and preferably x1>15% and x2>15%.

As a variant, the materials forming the alternating layers are chosen from among Si, SiO2, HfO2, Si3N4, ZrO; for example, the pairs of materials chosen for the first material and the second material may be Si/SiO2, or the pair HfO2/SiO2, or the pair SiO2/Si3N4, or the pair ZrO2/SiO2 or even pairs of metal materials.

According to one particular embodiment of a method or device of the invention, the substrate may be in one of the materials of the pair of materials forming the alternate layers.

In one method or device according to the invention, one and/or the other of the two materials forming the alternate layers may be amorphous or monocrystalline or poly-crystalline.

In one method or device according to the invention, the alternate layers can have a thickness of less than 10 nm or of between 1 nm and 10 nm or 20 nm.

One device according to the invention and/or fabricated according to a method of the invention, can be used as mould to produce patterns by nano-imprint in a layer of polymer coating a "product"substrate, or as negative so as to form nano-imprint moulds.

It is also possible, after the method of the invention, to add patterns by electronic lithography so as to obtain a complex mould. The use of a method according to the invention then makes it possible to reduce electronic lithography needs using a mask.

BRIEF DESCRIPTION OF THE DRAWINGS

FIGS. 6A, 6B, 6C, and 6D illustrate a method to use nano-imprint moulds and the phenomenon of so-called residual layer thickness.

DETAILED DESCRIPTION OF PARTICULAR EMBODIMENTS

Figure 1A:
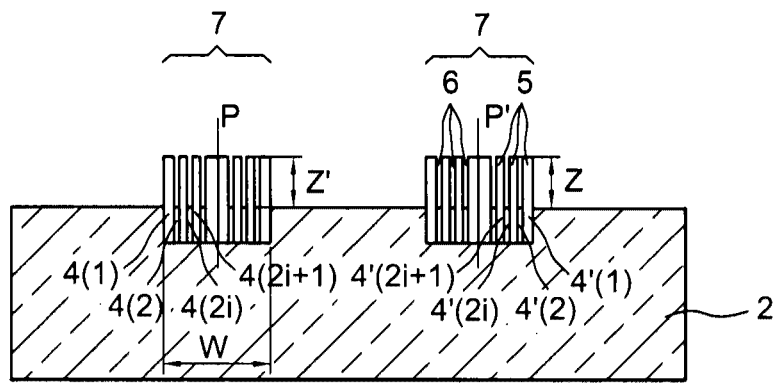
FIGS. 1A, 1B, 1C, 1D, and 1E illustrate various devices obtained according to the invention.

Embodiments of the invention are detailed below with reference to FIGS. 1 to 3 in which the references of the different elements are common to the different figures.

Embodiments of devices according to the invention are detailed in FIGS. 1A to 1D.

Each of these devices, or each of those fabricated using the methods described below, comprise a substrate 2, in a first material which is preferably a semiconductor material and can advantageously be in silicon, for example monocrystalline silicon. Another type of material can be chosen, for example SiO2, or SiGe, or Ge, or sapphire, or AsGa, or glass or quartz.

On the surface of this substrate there is at least one array of patterns 5 (or first patterns) or a group or an assembly 7, of width w, of said patterns 5. The tops of the different patterns are substantially all aligned in a plane parallel to the plane of the substrate 2. Similarly the feet of the different patterns all lie at substantially the same level relative to the surface of the substrate in which they are contained.

A group 7 of patterns has at least local symmetry along plane P, P' perpendicular to the plane of the substrate 2 and of each of FIGS. 1A-7D.

Each pattern is arranged substantially perpendicular to the substrate and is substantially in the form of a wall. In one dimension (the one perpendicular to the plane of each of FIGS. 1A-7D) it is largely extended relative to its width w; this is measured along the plane of FIGS. 1A-7D, and substantially lies between 1 nm and 20 nm. Preferably each pattern has a shape ratio of less than 10; this shape ratio is defined as the ratio between the height of a pattern, measured in a direction substantially perpendicular to the plane of the substrate, and its width w. The widths of the different patterns 5 are advantageously identical to each other. In the plane of FIGS. 1A to 7D, each pattern is of substantially rectangular shape. In one same array of patterns, these are arranged parallel to each other. The result along the plane of FIGS. 1A-7D, is a comb shape.

A trench or nano-trench 6 (or pattern of a second type of pattern) separates any two adjacent patterns 5 (or pattern of a first type of patterns), by a distance of substantially between 1 nm and 100 nm. The widths of the different nano-trenches 6 are advantageously identical to each other. The bottom of each trench 6 is in a material different from the material of the patterns 5. It is possible to selectively etch one of these two materials relative to the other.

Each of the FIGS. 1A-7D shows that the pattern/nano-trench alternation consists of an alternation of thin layers 4(i).

In one device according to the invention, the pair formed by the two types of materials of the pattern/nano-trench alternation is advantageously Si/SiGe$_y$, with y>20%. Alternatively, this pair of materials can be chosen from among the following pairs of materials: Si/SiO2, HfO2/SiO2, SiO2/Si3N4, ZrO2/

SiO2, Si/Au, Si/Pt, Si/Rh, Si/NO, SiO2/Au; it may be a semiconductor/metal pair or metal/metal such as Au/Cu or a pair of noble metals.

A first device of the invention is illustrated FIG. 1A.

In this case, each pattern 5 has a height Z relative to the neighbouring free surface 2' of the substrate 2. The top of each pattern protrudes relative to this surface by this height Z.

The nano-trenches in this example have a depth Z', measured relative to the top of the patterns, here substantially equal to Z. Advantageously the material of the bottom of the nano-trenches consists of the same material as the substrate 2.

The patterns 5 consist of a material different to that of the substrate, advantageously in $SiGe_{yGe}$ (yGe>17%) for a substrate 2 in Si.

In the illustrated embodiment, a group 7 of patterns has symmetry along a plane P perpendicular to the plane of the substrate 2. This also applies to each of FIGS. 1A-1E and for each of the devices obtained with the methods in FIGS. 2A-7D. On one side of this plane, an alternation of two materials is found in the form of layers 4(1), 4(i), ... 4(n) (n may lie between 2 and $10^4$, or for example between 2 and 100). On the other side of this same plane, there is an alternation of these two materials, symmetrical relative to the above-mentioned plane of symmetry, in the form of layers 4'(1), 4'(2), ... 4'(n). Layer 4'(i) is symmetric with layer 4(i) relative to plane P: these two layers have the same composition, same width and same height. This type of symmetry can be more generally found in the other embodiments. However there may be embodiments of the invention in which this symmetry is not present, for example if part of the layer is masked during an etching step.

Figure 1B:
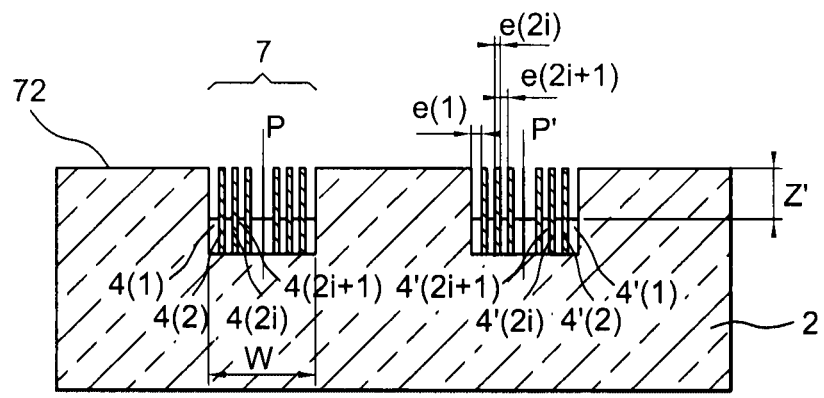

Another device of the invention is illustrated FIG. 1B.

Contrary to FIG. 1A, the tops of the patterns 5 lie substantially at the same level as the free surface 2' of the substrate.

The bottom of the nano-trenches 6 has a depth Z' relative to this same surface. The material of the bottom of the nano-trenches is then different from the material of the substrate 2.

Advantageously, the material of the patterns 5 consists of the same material as the substrate 2.

As in the preceding embodiment, symmetry of composition and thickness is also found in each trench relative to planes P, P', for layers 4(i) and 4'(i) either side of a plane of symmetry P perpendicular to the substrate.

Figure 1C:
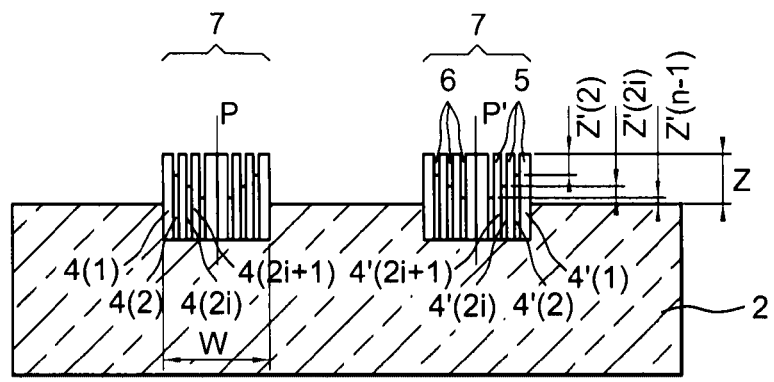

Another embodiment of the invention is illustrated FIG. 1C. In this device, as in the device in FIG. 1A, the top of the patterns is at a height Z above the free surface 2' of the substrate.

However, unlike the preceding embodiments, there are at least two nano-trenches whose depths are different.

As in the preceding embodiment, there is symmetry of composition and thickness for the layers 4(i) and 4'(i) either side of a plane of symmetry P, P' perpendicular to the substrate and to the plane of the figure. Preferably, in each trench, symmetry is also found on either side of the same plane regarding the depths of the trenches, z'(2i) being used to denote the depth of the nano-trenches obtained by etching the layers 4(2i), 4'(2i).

Advantageously, the depths z'(2i) increase starting from the edge of the group of patterns 7 and extending towards the centre of this group of patterns 7. The same distribution is found, symmetrically, on the other side of plane P, P'.

In addition, at least two materials forming the bottoms of at least two nano-trenches have different compositions, the difference in composition influencing speed of etching.

Two layers forming the bottom of the nano-trenches 6 having one same depth have an identical composition.

Two layers forming the bottom of the nano-trenches 6 having different compositions have different depths.

As explained below, the unequal distribution of trench depths, at the time of nano-imprint, can offset the non-homogeneities of the residual thickness of the material in which the imprint is made.

Figure 1D:
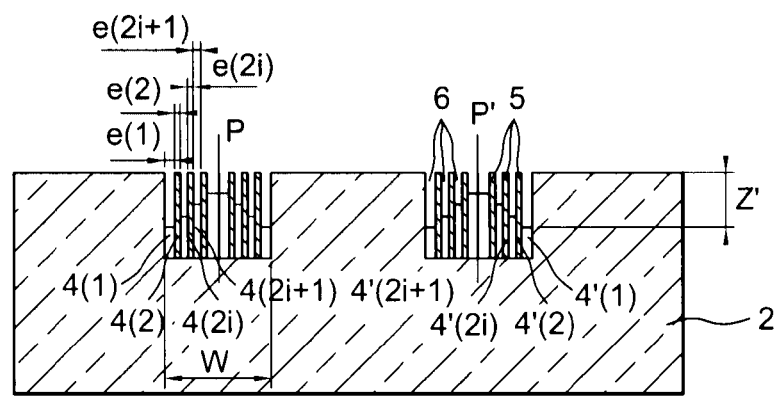

Another embodiment of the invention is presented in the device shown FIG. 1D.

In this device, as for the device in FIG. 1B, the top of the patterns 5 lies at the same level as the free surface 2' of the substrate 2.

As in the device described in FIG. 1C, there is disparity in trench depth between at least two nano-trenches 6.

Let z'(2i+1) be the depth of the nano-trenches obtained by etching the layers 4(2i+1), 4'(2i+1), i=0, ... n.

Advantageously the depths z'(2i+1) decrease starting from the edge of the group of patterns 7 and extending towards the centre of this group of patterns 7. The same distribution is found symmetrically on the other side of the plane P, P'.

The symmetry in composition and thickness is found as in FIG. 1C, but also symmetry of the trench depth.

The observations regarding composition made with respect to the embodiment in FIG. 1C remain valid.

Figure 1E:
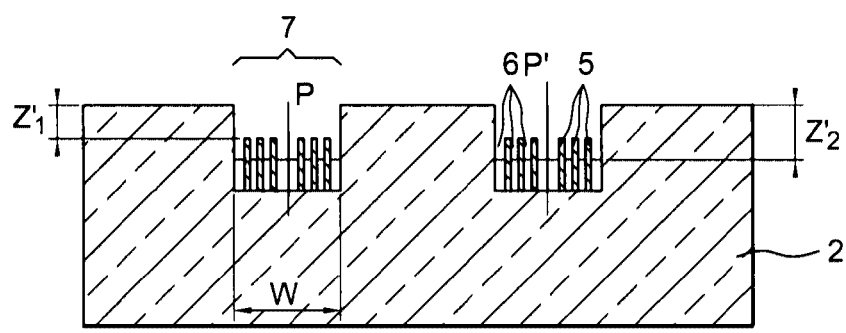

Another device according to the invention is illustrated FIG. 1E.

Contrary to FIG. 1B, the tops of the patterns 5 lie below the level of the free surface 2' of the substrate, at a depth $Z_1'$ relative to this surface.

The bottom of the nano-trenches 6 lies at a depth $Z_2'$ relative to this same surface. The material of the bottom of the nano-trenches is then different from the material of the substrate 2. The material of the patterns 5 can consist of the same material as the substrate 2; but in this case the substrate 2 is masked to attack region 7 without attacking the surface of substrate 2. Or else another material can be formed on the substrate 2 (as in the case for an SOI) in which trenches are made and on whose sidewalls the layers are caused to grow. This material is different from the material of the patterns 5 and 6 and is etched selectively relative to these elements 5 and 6.

As in the preceding embodiment, symmetry of composition and thickness is also found in each trench, relative to planes P, P', for the layers 4(i) and 4'(i) either side of a plane of symmetry P perpendicular to the substrate.

Other structures of a device according to the invention are described in the examples of methods given below.

A method according to the invention is illustrated FIGS. 2A to 2E.

The starting material is a substrate 2 comprising at least one multilayer 17. This comprises two composite regions 4 et 4' symmetric with each other relative to a plane P perpendicular to the substrate and to the plane of the figure, and respectively containing layers 4(i), 4'(i). The layers 4(i) (respectively 4'(i)) consist alternate fashion of two materials which can be etched selectively relative to one another. The two composite regions form a group 7 of width w and depth h4. The layers 4(i), 4'(i) have at least one portion perpendicular to the main plane of the substrate 2; this portion lies flush with the surface of the substrate. Preferably one of the alternating materials is etched at the same speed as the substrate, advantageously it is the same material as the substrate. If the substrate is in silicon, the two materials are advantageously in Si and in SiGe.

Figure 2A:
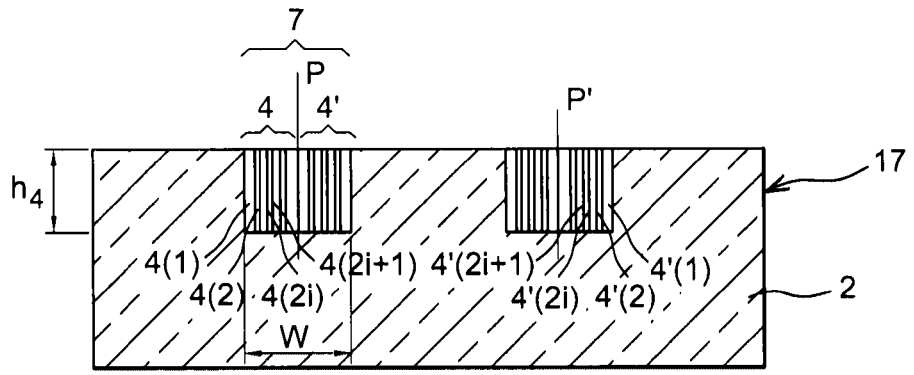
FIGS. 2A, 2B, 2C, 2D, and 2E illustrate various methods to form nano-imprint moulds according to the invention.
Figure 2B:
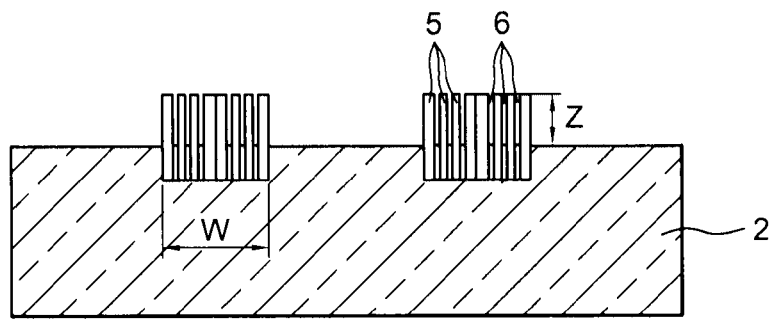
Figure 2C:
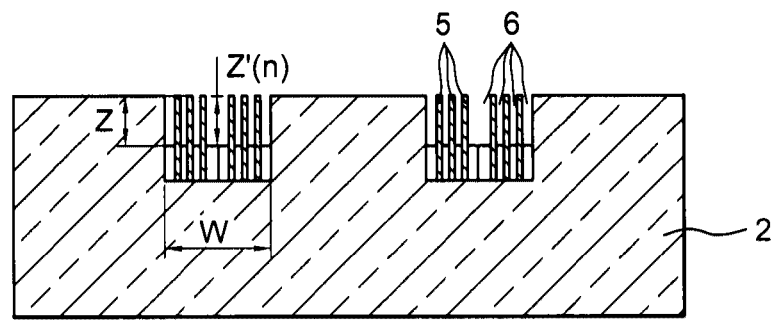

In FIGS. 2B and 2C, one material is selectively etched with respect to the other.

Etching can preferably etch the substrate and the material of the alternating layers which has an etching speed close to that of the substrate, thereby forming patterns 5 on the surface of the device (FIG. 2B).

This gives a structure of the type shown FIG. 1A. It is also possible to obtain a structure of the type shown on FIG. 1C provided adequate compositions of layers 4(2i) and 4'(2i) are chosen, as already explained above with reference to FIG. 1C.

The structure thus obtained can be used as nano-imprint mould for example to form trenches in an imprint material, or as "master" negative to form a nano-imprint mould.

Alternatively, it is possible to choose etching such that the etched material is preferably selectively etched relative to the substrate and to the material which has an etching speed close to or equal to that of the substrate (FIG. 2C).

This gives a structure of the type shown FIG. 1B. It is also possible to obtain a structure of the type shown 1D provided that adequate compositions of the layers 4(2i+1) and 4'(2i+1) are chosen, as already explained above with reference to 1D.

Figure 2D:
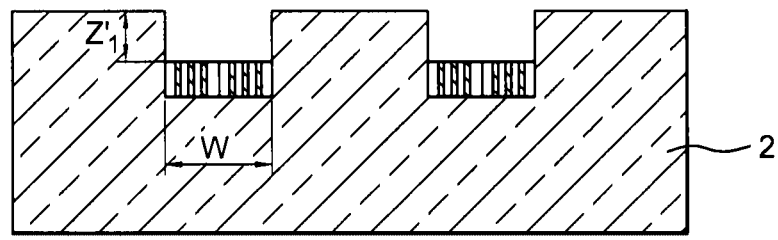
Figure 2E:
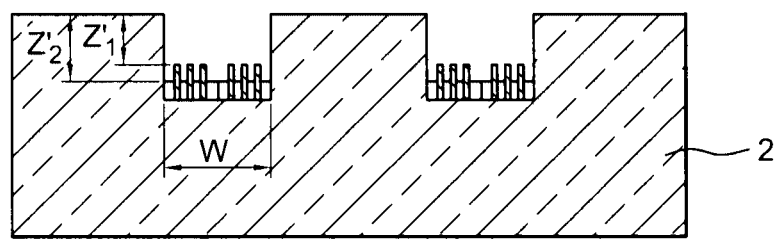

In the case shown FIGS. 2D and 2E, first (FIG. 2D) the two materials are anisotropically etched, which leads to reducing the level of the two materials in each trench, to a level that is substantially identical for these two materials.

Next, (FIG. 2E) one material is selectively etched with respect to the other. This gives a structure of the type shown FIG. 1E.

The structure thus obtained can be used for example as nano-imprint mould to form protruding patterns of imprint material, or as "master" negative to form a nano-imprint mould.

FIGS. 3A to 5F illustrate embodiments of the invention which notably allow an initial structure to be obtained of the type described in FIG. 2A. Some of these methods can be used to obtain other structures. These methods also comprise a subsequent etching step.

Said method according to the invention is illustrated in FIGS. 3A to 3G.

Figure 3A:
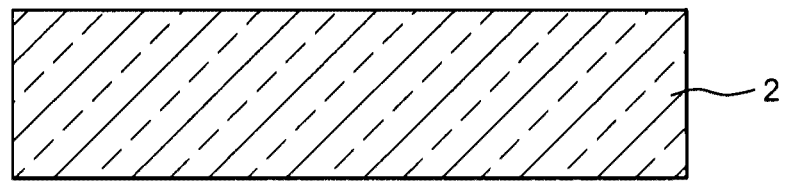
FIGS. 3A, 3B, 3C, 3D, 3E, 3F, and 3G illustrate steps of a first method according to the invention.
Figure 3B:
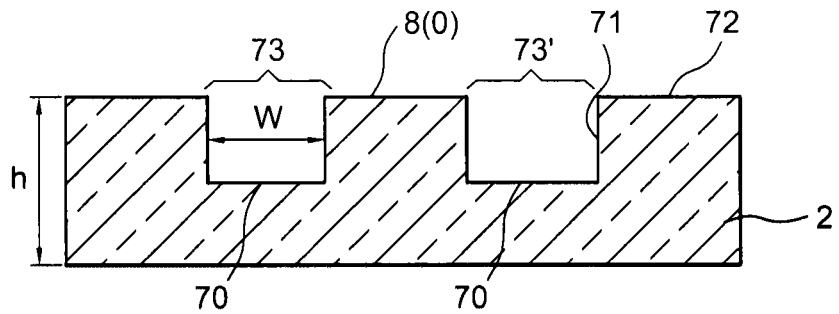

In a substrate 2, advantageously in semiconductor material e.g. silicon (FIG. 3A), trenches 73 and 73'are etched of depth h and width w (FIG. 3B). Therefore a distinction can be made between three types of surfaces on or in the substrate: the trench bottoms 70, the sidewalls 71 of the trenches and the top 72 of the substrate (the upper part of the substrate 2 which is not affected by etching of the trenches). These surfaces, which are formed of a material compatible with depositing of the chosen alternate conforming layers, define a surface topology 8(0), i.e. a 3D surface comprising the top of the substrate and the surfaces of the trenches which are located at different levels along axis y.

Figure 3C:
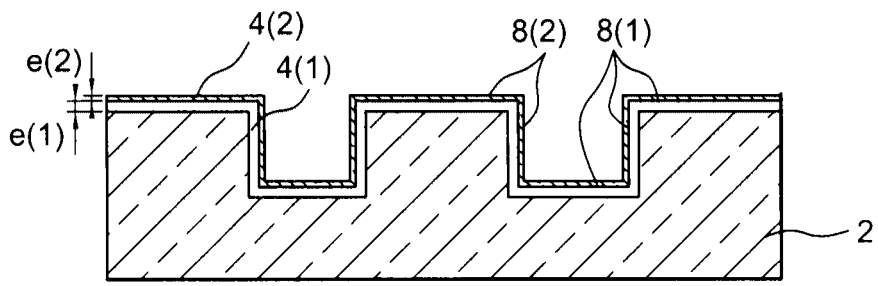

A thickness e(1) of a first conforming layer 4(1), of low roughness and in a first material, is deposited on the entire surface 8(0) (FIG. 3C). Generally in the entirety of this application, a layer is said to be conforming if it follows the topology of the surface 8(0) on which it is deposited. This first material is chosen so that it can be etched selectively relative to the substrate 2. It is in SiGe for example. This layer has a free surface 8(1).

Next, on this surface 8(1) in a first material, a layer 4(2) is deposited that is conforming, of low roughness and of thickness e(2) in a second material (FIG. 3C). The material of the layer 4(2) is chosen so that it can be etched selectively relative to the material of layer 4(1). Generally, in the entirety of this present application, etching is said to be selective between two materials if, during the etching step, one of the materials is preferably etched with respect to the other i.e. the speed of etching of one of the materials is greater than the etch speed of the other material. Preferably, the material of layer 4(2) is etched at the same speed as the substrate 2, advantageously this material is the same as that of the substrate e.g. silicon.

Figure 3D:
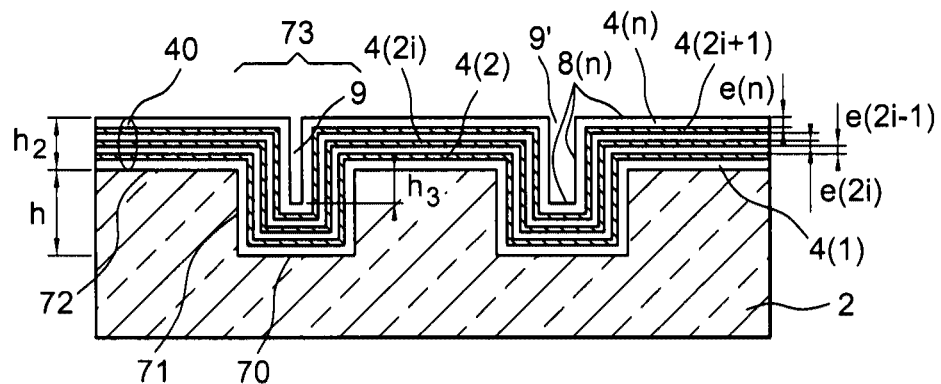

These steps are repeated so as to obtain n conforming layers 4(1) to 4(n) of thicknesses e1 to e(n) forming a composite film 40 of thickness h2 over the entire topology (FIG. 3D). The layer 4(i+1) is deposited on the surface 8(i) of layer i; layer 4(i+1) being in a material chosen so that it can be selectively etched relative to the material forming the underlying layer 4(i).

This gives rise to an alternation of the two above-cited materials which can be etched selectively with respect to each other:
the uneven layers 4(1) to 4(2x+1) consisting of the first material,
and the even layers, which are deposited alternately with the uneven layers and are formed in the second material. These even layers are referenced 4(2) to 4(2x), or 4(2) to 4(2x+2), depending on whether the total number of layers deposited on the substrate is even or uneven.

Each of the thicknesses e(1) to e(n) is between a few nanometres and a few tens of nanometres for example between 1 nm and 100 nm, preferably between 1 nm and 20 nm.

Preferably the even alternate layers all have the same thickness; similarly the uneven layers preferably all have the same thickness. Advantageously, each layer has a thickness of around 10 nm+/−2 nm for example. The alternating layers may all be of the same thickness, for example the thicknesses e(1) to e(n) may equal 10 nm.

These layers may be polycrystalline of low roughness. Preferably at least one of the deposited materials is amorphous or has a monocrystalline structure; advantageously the two deposited materials are amorphous or have a monocrystalline structure. The depositing of each layer can be made using CVD for example or PECVD, or even by epitaxy.

The total thickness h2 of the film 40 consisting of the alternating layers may be such that the thinnest trenches are filled with this film 40.

The thickness h2 is preferably strictly less than the depth h of the trenches. It is such that, in each trench 73, 73' one portion of the surface 8(n) of the outermost layer of the stack (layer 4(n)), along axis y, lies at a level lower than the top 72 of the substrate 2. This gives at least a height h3 of material of layer 4(n) below the level 72 of the substrate or lying between level 72 of the substrate and the level of the bottom of the trenches.

Figure 3E:
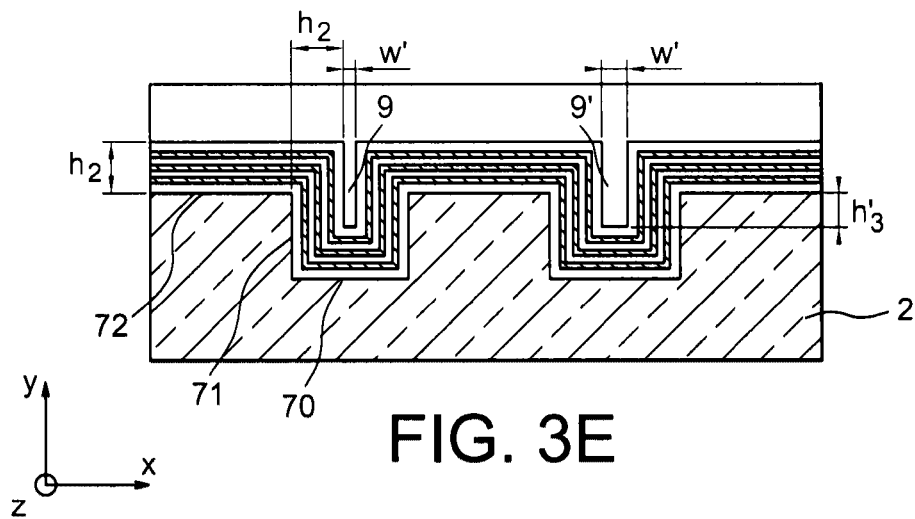

Should a trench not be completely filled with the alternate conforming layers, there will be a residual trench 9,9' of width w' in the middle of the non-filled trench, above the stack 40. In this case, a filler material 3 is deposited, chosen so that it can be selectively etched relative to the material forming the last conforming layer 4(n) of the stack 40; advantageously this last conforming layer is such that the filler material 3 can be etched at a speed close to the speed for the substrate material (FIG. 3E). For example, the filler material 3 is identical to the substrate material.

The filler material 3 is deposited on all the surface 8(n), thereby filling the trenches 9, 9', of width w', which form a residual topology of the surface 8(n). These trenches 9, 9', filled with the filler material 3, are separated from the bottom 70 and from the sidewalls 71 of trenches 73, 73' and from the top 72 of the substrate by the composite film 40 of thickness h2.

The device is then thinned by a thickness at least equal to h2, for example by chemical mechanical polishing so as to remove at least all the thickness of the composite film present above the top 72 of the substrate (FIG. 3F) and the optional layer of filler material 3 present above the top 72 of the substrate.

Figure 3F:
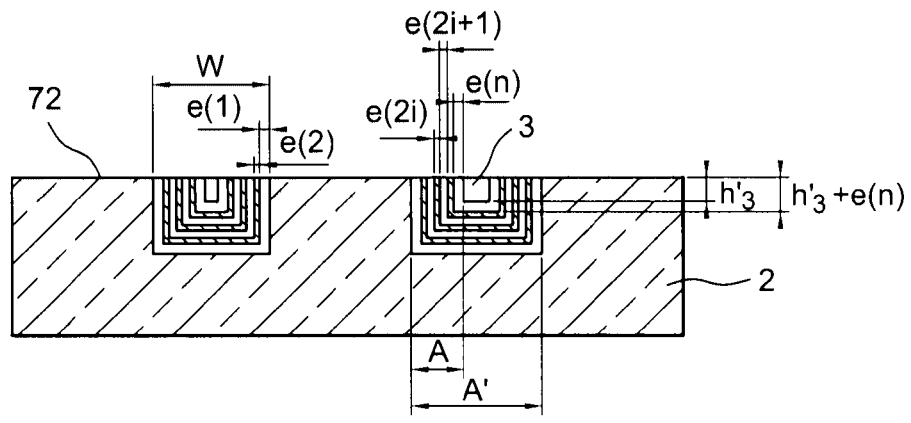

Thinning is advantageously performed so as to leave a minimum thickness h3' of filler material 3 in the trenches 73, 73' (FIG. 3F). This minimum height, after polishing, allows a minimum height h3'+e(n) to be maintained, along axis y, of material of the last deposited layer 4(n).

This gives a structure from which the steps in FIG. 2B or 2C can be conducted.

This structure is then (FIG. 3G) subjected to chemical or physical etching or chemically assisted etching (RIE-type etching); the particularity of this etching is that it selectively etches one of the two materials forming the alternate conforming layers 4(i) relative to the other. One of the two materials is etched less quickly than the other, thereby forming patterns 5 on the surface of the device.

Figure 3G:
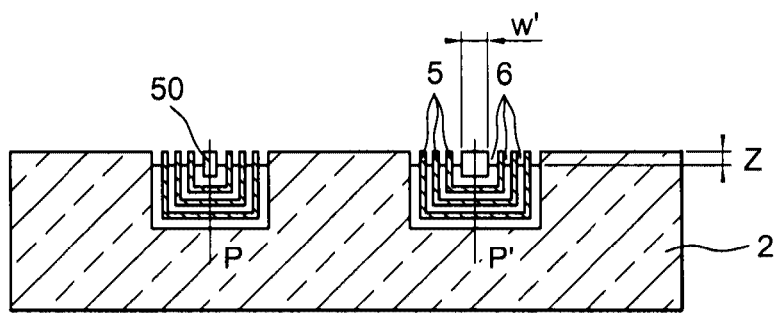

In the example shown FIG. 3G, the variations in etching depth form patterns 5 of width e(2i) separated from each other by nano-trenches 6 of width e(2i+1) and depth Z. These patterns are located in the trenches 73, 73' filled with the alternate conforming layers 4(i). In one same trench 73 for which a filler material 3 was used, the group of patterns is separated into two parts by a pattern 50 of width w' in filler material. The patterns 5 in this embodiment of the invention consist of the second material, for example a material identical to the material of the substrate; the bottom of the nano-trenches 6 consists of the first material.

A structure is thereby obtained which has symmetry relative to a plane P, P' which passes through a portion in filler material i.e. pattern 50. This plane therefore separates the group of patterns made in one same trench 73 into two symmetrical parts.

It can be seen FIG. 3G that one particularity of this embodiment is that one layer 4(i) of the stack 40 is arranged in a trench 73 in continuous manner, on each side of the trench and in its lower part. The conditions of symmetry of thickness, composition and etching speed relative to plane P are therefore ensured.

Alternatively it can be envisaged that selective etching should be chosen so as to produce patterns which protrude relative to the substrate, consisting of the first material as is described in the following embodiment of the invention.

The device in FIG. 1G can be used as mould or imprint stamp to form a nano-imprint mould, or directly as nano-imprint mould.

Another embodiment of a method according to the invention is described in FIGS. 4A to 4E.

Figure 4A:
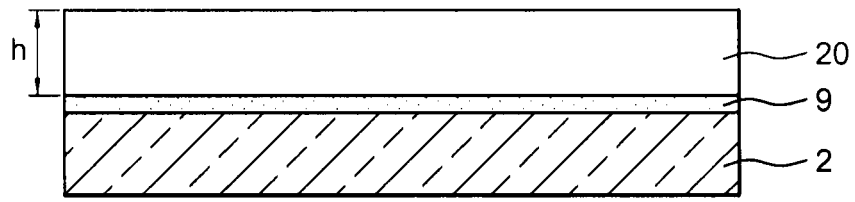
FIGS. 4A, 4B, 4C, 4D, and 4E illustrate steps of a second method according to the invention, a layer of material inhibiting the deposit of conforming layers being present on one of the surfaces.

In this embodiment, the device is made in a substrate of SOI type i.e. a substrate comprising a buried insulator layer 9 separating a thin surface layer 20 of height h in semiconductor material from a thick substrate 2 ensuring the rigidity of the assembly (FIG. 4A). The buried insulator layer 9 is chosen so as to limit and/or prevent the deposit of materials forming the alternate conforming layers.

This insulating layer can advantageously be in silicon oxide and the surface film in silicon.

Figure 4B:
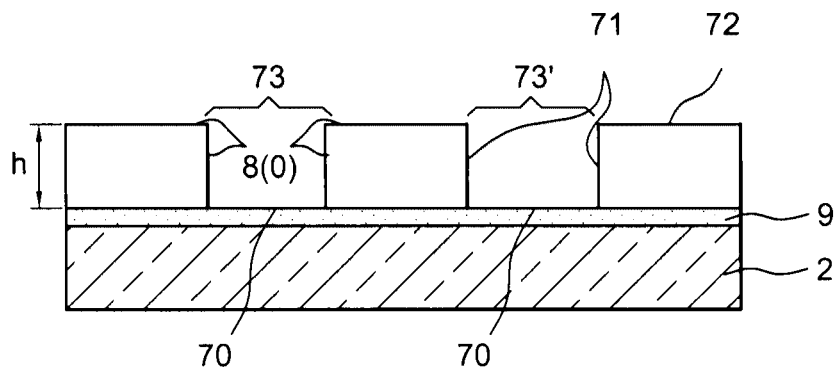

As in the first embodiment, trenches 73, 73' are etched in the surface layer 20, for example by photolithography. The buried insulator layer 9 forms a stop layer for this etching. The bottom of the trenches therefore consists of layer 9 in insulating material (FIG. 4B). The depth of the trenches is therefore equal to the thickness h of the surface film 20.

Since the material forming the buried insulating layer 9 therefore forming the bottom of the trenches does not permit the deposit of materials for the alternate conforming layers 4(i), the active deposit surface 8(0) consists of the top 72 of the substrate and the sidewalls 71 of the trenches 73. This active surface therefore consists almost solely of surfaces of the surface layer 20.

Figure 4C:
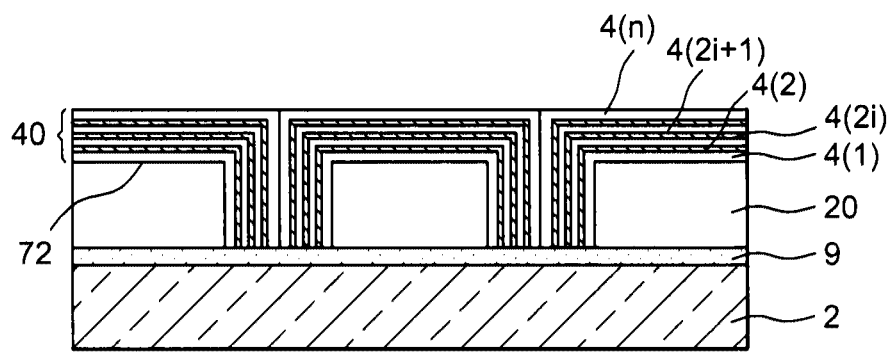

As in the embodiment described previously with reference to FIGS. 3C to 3E, a composite layer of thickness h2 is deposited. It comprises conforming layers 4(i) such that alternation is obtained between a first material and a second material (FIG. 4C). The layers 4(i+1) are deposited in conforming fashion on the surface 8(i) of layer 4(i), the layer 4(i+1) consisting of a material whose etching is selective relative to the material forming the conforming layer 4(i).

Therefore each layer is deposited at least on the two sidewalls 71 of each trench 73, symmetrically.

These layers are chosen following the same criteria as in the first embodiment of the invention. However, the insulating material 9 forming the bottom of the trenches, does not allow the depositing of alternate conforming layers. There is therefore no depositing of layers 4(i) following the bottom of the trenches; the portions of alternate layers present in the trenches 73, 73' are solely oriented perpendicular to the mean plane of the substrate 2.

The height of each alternate conforming layer between the bottom 70 of the trenches and the top of the substrate, in this embodiment, is always equal to the depth h of the trenches. There is therefore no limitation to the thickness h2 of the composite layer 40 relative to the depth h of the trenches, contrary to the first embodiment.

If some trenches are not completely filled with layer 40, advantageously the non-filled parts of these trenches are filled with a filler material such as described in the above embodiment.

Figure 4D:
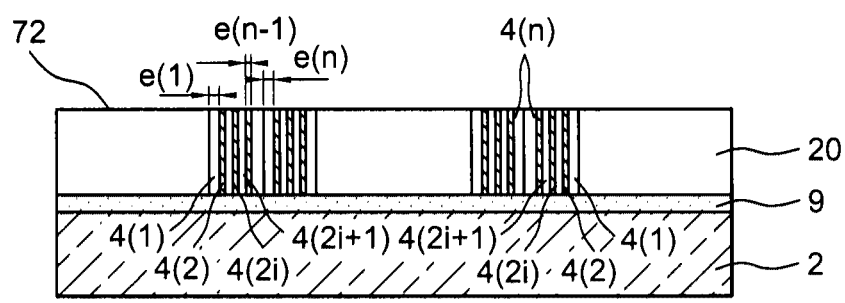

Next, the device is thinned for example during chemical mechanical polishing, so as to remove at least those portions of the composite layer 40 above the top 72 of the substrate, and thereby obtain a device in which the alternation of two materials which can be selectively etched relative to one another, is only present in the regions corresponding to the trenches 73, 73' (FIG. 4D). Contrary to the preceding embodiment, there are no portions in trenches 73,73' of alternate layers 4(i) parallel to the plane of the substrate (to be compared with FIGS. 3F and 3G). Control over the extent of thinning or over the thickness over which thinning is carried out is therefore less critical than in the first embodiment of the invention.

A structure is therefore obtained from which the steps in FIG. 2B or 2C can be conducted.

This structure is then subjected to chemical or physical etching (FIG. 4E); the particularity of this etching is that it selectively etches one of the two materials forming the alternate conforming layers 4(i) relative to the other. One of the two materials is etched less quickly than the other, thereby forming patterns 5 on the surface of the device.

Figure 4E:
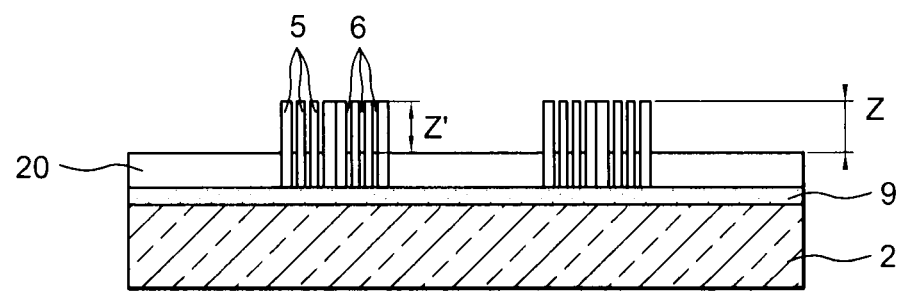

In the example shown FIG. 4E, the variations in etching depth form patterns 5 of width e(2i+1) separated from each other by nano-trenches 6 of width e(2i) and depth Z. The substrate 2 is also etched at an etch speed close to that of the material forming layers 4(2i). These patterns therefore protrude relative to the surface of the remainder of the substrate 2. In one same trench 73 for which a filler material 3 has been used, the group of patterns is separated into two parts by a pattern in filler material. The patterns 5 in this embodiment of the invention consist of the first material; the bottom of the nano-trenches 6 consists of the second material, for example a material identical to the substrate material.

This gives a structure which has symmetry relative to a plane P, P' which optionally passes through a portion in filler material. This plane therefore separates the group of patterns made in one same trench 73 into two symmetrical parts.

Alternatively, it can be considered that selective etching should be chosen so as to produce patterns which do not protrude relative to the substrate, consisting of the second material as described in the preceding embodiment.

The device in FIG. 4E can be used as imprint mould or stamp to form a nano-imprint mould, or directly as nano-imprint mould.

Another embodiment of the invention is described in FIGS. 5A to 5F.

The description of this embodiment of the invention will only detail variants compared with the preceding embodiments.

Figure 5A:
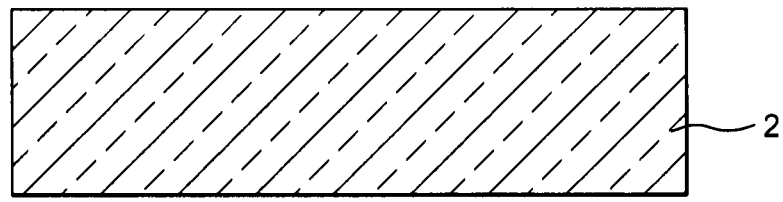
FIGS. 5A, 5B, 5C, 5D, 5E, and 5F illustrate steps of a third method according to the invention, layers of material inhibiting the deposit of conforming layers being present on the field of the wafer and at the end of a line.

In one method according to the third embodiment of the invention, trenches 73, 73' of width w are etched in a substrate 2 advantageously in semiconductor material e.g. silicon (FIG. 5A).

Next, a thickness $e_s$ of spacer-type material 10 is deposited on the sidewalls 71 of the trenches 73. This material is advantageously chosen so that:

it can be selectively removed relative to the material of the substrate 2 and relative to the future layer of material limiting the deposit of alternate conforming layers, it does not allow the formation of this last material.

This material may be Si for example or SiO2 or Si3N4 or HfO2 or SiGe . . . etc. It is deposited by CVD for example on all the surfaces of the substrate, then etched anisotropically so that this material only remains on the sidewalls 71 of the cavities 73.

Figure 5B:
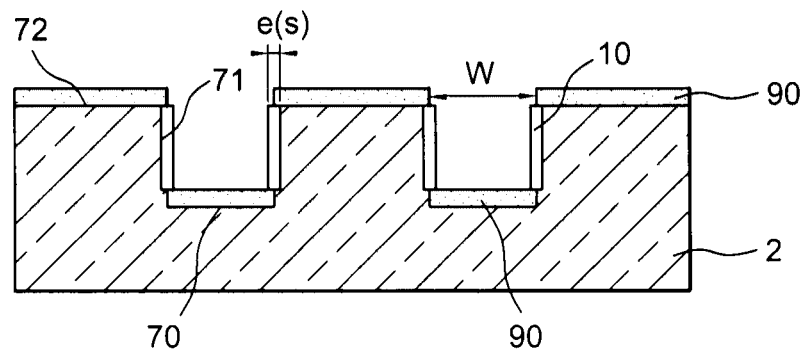
Figure 5C:
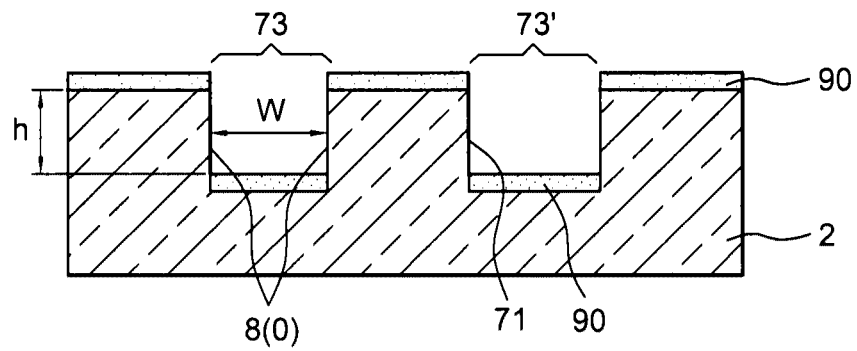
Figure 5D:
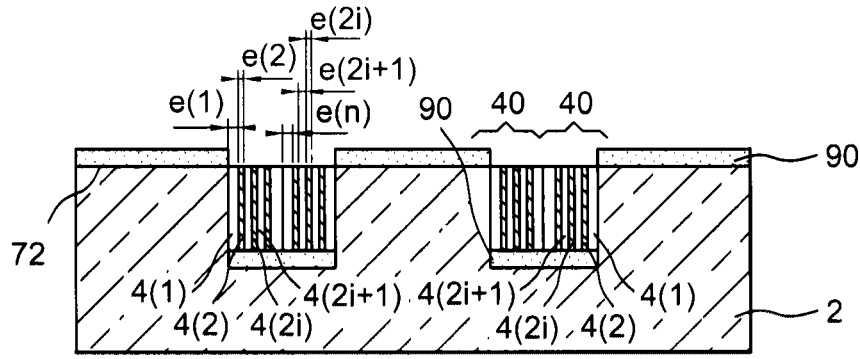

Then, on all the surfaces not coated with the spacer 10, a material 90 is formed by deposit or growth which limits or inhibits the depositing of alternate conforming layers (FIG. 5B). The presence of spacer material on the sidewalls means that this material limiting the alternate layers, of oxide type e.g. silicon oxide, is only deposited in this embodiment following two configurations: at the bottom 70 of the trenches and on the top 72 of the substrate.

Advantageously the spacer material can then be removed (FIG. 5C), for example by selective etching or dissolution. It can also be preserved, for example if it can act as binding layer.

As in the preceding embodiments, alternate conforming layers are deposited on the surface 8(0), this surface corresponding to the surfaces not coated with the material 90 limiting or inhibiting the growth of the conforming layers. Said surface 8(0) therefore corresponds either to the surface of the spacer material, or to the surface freed when removing the spacer material. This surface 8(0) is a discontinuous surface consisting of all the sidewalls 71 of the trenches 73 with or without spacer.

The alternate conforming layers are deposited using the same technique as in the preceding embodiments.

On the surface 8(0), a thickness e(1) of conforming layer 4(1) in a first material is deposited, with a free surface 8(1). On this surface 8(1) a thickness e(2) of conforming layer 4(2) is deposited consisting of the second material and having a free surface 4(2). This process is continued until n alternate layers are obtained, by alternating the two materials. The thickness e(i) of each layer is adjusted to meet the needs of the desired final configuration and is advantageously less than 10 nm.

Owing to the presence of the layers of material 90 limiting the growth of conforming layers on the bottom 70 of the trenches and top 72 of the substrate 2, the alternate conforming layers are only deposited in the trenches parallel to the sidewalls 71 of the trenches i.e. perpendicular to the plane of the substrate 2.

Figure 5E:
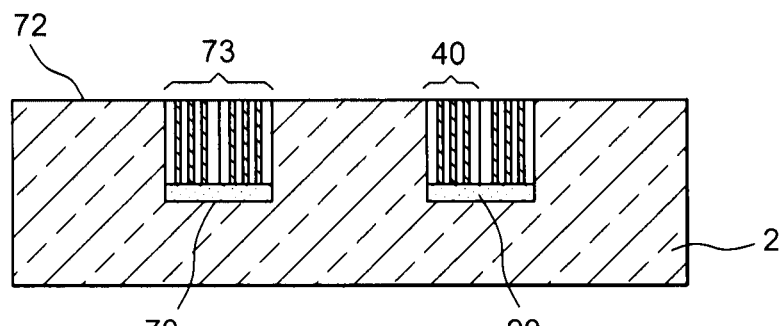

Next, the overthickness present on the top 72 of the substrate is removed (FIG. 5E). This overthickness consists of at least the layer 90 in material limiting or inhibiting the deposit of alternate conforming layers 4(i). This layer 90 can be removed by polishing.

The layer 90 can advantageously be removed by selective removal of its constituent material, for example by chemical attack. The alternate conforming layers 4(i), present in the trenches 73, 73' are therefore not deteriorated by chemical mechanical polishing. However polishing permits this alternation to be exposed, a conforming layer being deposited horizontally on the section of thickness e(i) of the preceding layer.

If the trenches 73 are not fully filled by the composite layer 40, it is preferable to deposit a filler material to fill the remaining free portions. This filler material is then preferably thinned e.g. by polishing to remove the overthickness.

This leads to obtaining a structure from which the steps in FIG. 2B or 2C can be conducted.

This structure is then subjected to chemical or physical etching (FIG. 5F); the particularity of this etching is that it selectively etches one of the two materials forming the alternate conforming layers 4(i) relative to the other. One of the two materials is etched less quickly than the other, thereby forming patterns 5 on the surface of the device.

Figure 5F:
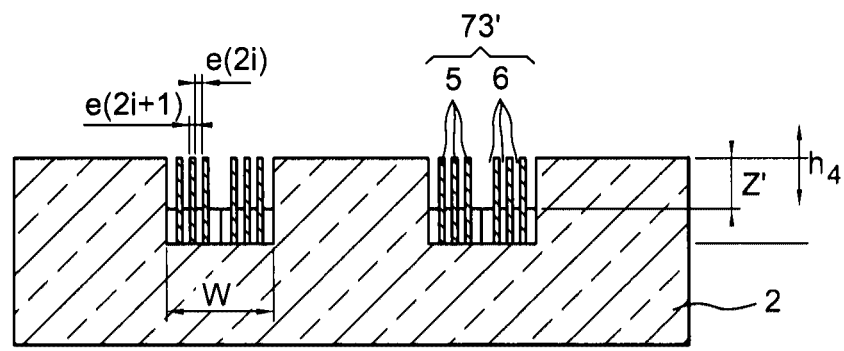

In the example in FIG. 5F, the variations in etching depth form patterns 5 of width e(2i) separated from each other by nano-trenches 6, of width e(2i+1) and depth Z'. These patterns are located in the trenches 73, 73' filled with alternate conforming layers 4(i). In one same trench 73 for which a filler material was used, the group of patterns is separated into two parts by a pattern in filler material. The patterns 5, in this embodiment of the invention, consist of the second material e.g. a material identical to the substrate material; the bottom of the nano-trenches 6 consists of the first material.

This gives a structure which has symmetry relative to a plane P, P' which optionally passes through a portion in filler material. This plane therefore separates the group of patterns in one same trench 73 into two symmetrical parts.

Alternatively it can be considered that the selective etching can be chosen so as to produce patterns which protrude relative to the substrate, consisting of the first material as already described in the preceding embodiment of the invention.

The device in FIG. 5F can be used as imprint mould or stamp to form a nano-imprint mould, or directly as nano-imprint mould.

From the devices in FIGS. 3F, 4D and 5E, it is also possible to produce a structure such as shown FIGS. 1E and 1E', by anisotropic etching of the two types of materials deposited in the trenches, to bring them both to the same level under the surface of the substrate (as in FIG. 2D), then by etching one of the two materials to obtain patterns which protrude relative to a trench bottom, but the top of the patterns being in the trench.

Figure 6A:
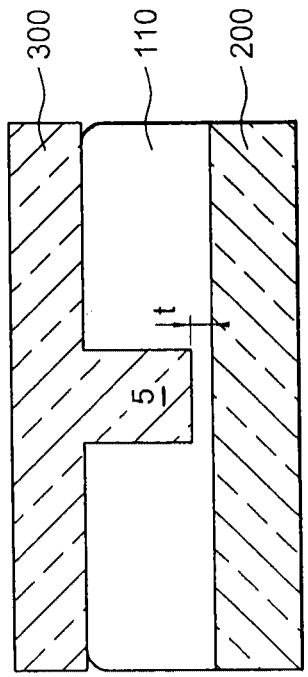
Figure 6A:
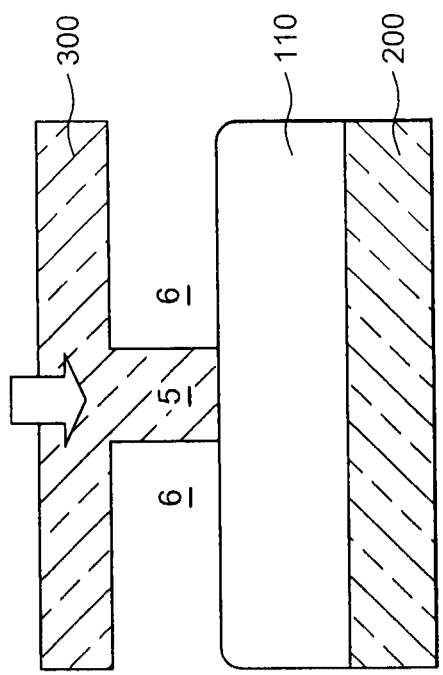

When using a nano-imprint mould 300, the mould comprising at least one array 7 of patterns 5(j), is pressed into a layer of malleable material 110 present on a substrate 200 e.g. in resin; this malleable layer 110 will be called resin in the remainder hereof. When pressing, there remains a thickness $t_i$ of resin 110 between the patterns 5(j) and the substrate 200 to be lithographed (see FIGS. 6A, 6A' in which only one pattern 5 is shown). If there is variation in the density of the mould patterns or if the array of patterns is homogeneous and dense (FIG. 6B), after pressing there may be local non-homogeneity of the residual thickness $t_i$ of resin present between the different patterns 5(i) and the substrate 200 (FIG. 6B').

During pressing, the resin 110 effectively flows into the free volumes 6 located around the patterns, being replaced by the pattern 5 or patterns 5(j). In a regular array of patterns of width W, the free volume v(j)–(j+1) separating two adjacent patterns being constant, the total free volume located at a given distance D from a pattern varies in relation to the position of the pattern in the array, owing to edge effects. The total free volume at a distance D from a pattern 5 differs depending on whether the pattern is in the centre of the array of patterns (FIG. 6B, patterns 5(2) and 5(3)) or close to the edges of the array (FIG. 6B, patterns 5(1) and 5(4)). In FIGS. 6A-6D only a few patterns are illustrated, but the above-explained effect is all the more present the greater the number of patterns.

With a device produced according to the invention, the array of patterns consists of patterns 5 obtained inside a trench 73. For a device according to any of FIG. 1A, 4E or 6B, since the mould has patterns 5 exceeding the level of the substrate 2 (or 300 in FIG. 6B) by a height Z, there is more free volume close to the edges of the array 7 of patterns than in the centre of the array 7. On the other hand, for a device according FIG. 1B, since the level of the patterns 5 is the same as the level of the substrate 2, the available free volume close to the edge of the array 7 of patterns is smaller than in the centre of the array.

The less available free volume there is around a pattern 6 pressed into the resin, the less the resin 110 is able to flow to give way to a pattern and the greater the remaining residual thickness. In an array of patterns, the difference between the available free volume around a pattern positioned approximately in the centre of the array and the available free volume around a pattern located approximately on an edge of the array therefore leads to non-homogeneity of the residual thickness $t_i$.

A pressing step, such as one of those in FIGS. 6A, 6A', 6B, 6B', can be followed by an etching step, which allows the substrate 200 to be exposed in the regions in which the mould patterns have penetrated. During this etching, the points at which the residual thickness is the thinnest are etched quicker and the surface of the underlying substrate 200 is reached first. The etching is continued however until this surface of the substrate 200 is reached in all the patterns. There is therefore over-etching or additional etching of the patterns first exposed. During this additional etch, the patterns first exposed opened are widened due to lateral etching inherent in the etching methods, for example plasma etching. Non-homogeneity of the residual thicknesses $t_j$ therefore leads to loss of control over lateral dimensions after etching. This raises problems for the fabrication of nanostructures which require a very good dimensional control.

One way to overcome this problem is to optimize the available free volume around the patterns. With respect to a method or device according to the invention, the free volume (j)–(j+1) is caused to vary between two patterns 5(j) by modulating the depth z(j) of the nano-trenches 6. This is the case for the structures in FIGS. 1C and 1D.

Figure 7A:
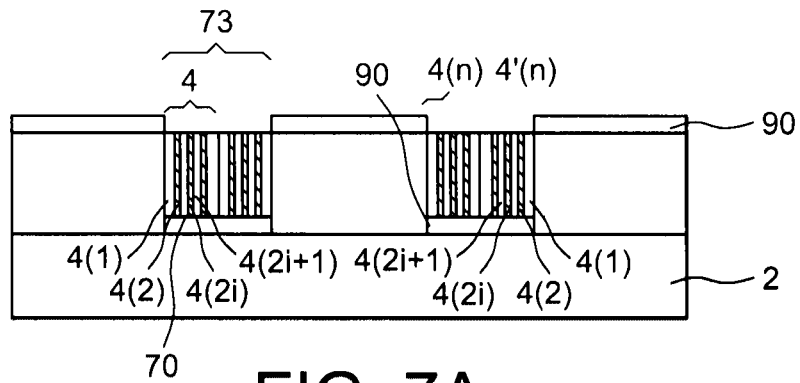
FIGS. 7A, 7B, and 7C illustrate an embodiment in which one of the types of alternate material in the composite layer comprises a variation in composition from one layer containing this material to another.
Figure 7B:
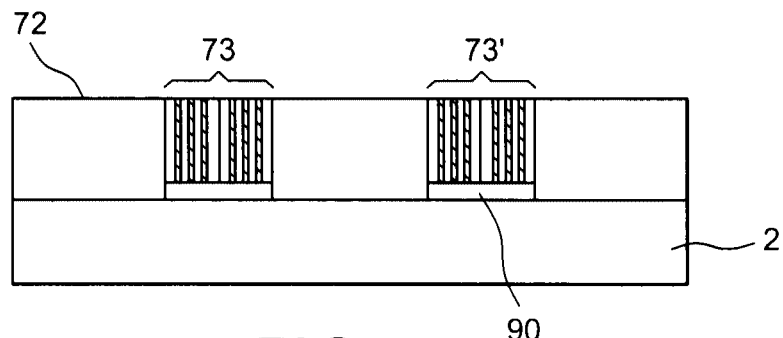
Figure 7C:
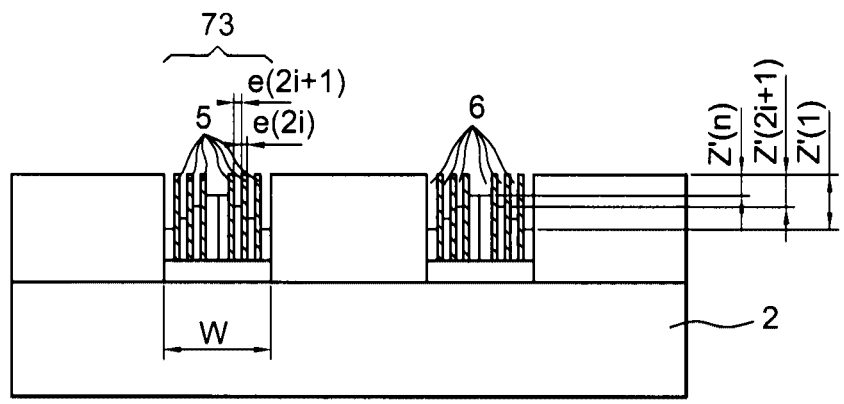

One method which can be used to produce this type of structure is illustrated FIGS. 7A to 7C; this method is illustrated in an embodiment of the invention of the type illustrated FIGS. 5A to 5F; FIGS. 7A to 7C then replacing FIGS. 5D to 5F. Alternatively, it is possible to use the principle described below in FIGS. 7A to 7C in embodiments of the invention conforming to the methods described in FIGS. 3A-3G and/or 4A-4E.

When filling the trenches 73,73' with the alternate conforming layers, the etch speed of one of the materials is modified. This modification is made by modulating the composition of one of the alternate materials, from one layer consisting of this material to another (FIG. 7A). For this purpose a material can be used whose chemical composition can be adjusted from one layer to the other, for example an alloy that is at least binary, whose composition is caused to evolve from one layer to the other. Examples of such materials are given further on.

Therefore, in one advantageous method according to this embodiment, at least two uneven layers (2i+1), consisting of the first material, have a different composition. For example if the first material is $SiGe_x$ (x>15% or even x>20%), one uneven layer can have a composition $SiGe_x$ and another uneven layer a composition $SiGe_{x'}$, preferably 0<x'<x, x' also being more than 15% or 20%. In addition, x may vary from one uneven layer to another if more than two uneven layers have different compositions, x preferably being greater than 15% or 20% and less than x'. These differences in composition are chosen so as to induce a variation in etching speed of the uneven conforming layers. The etching speeds obtained may lie for example between that of the substrate and/or of the second material and that of the first material, here $SiGe_x$. Alternatively the even layers, consisting of the material whose etch speed is close to or equal to that of the substrate, comprise a variation in composition between at least two layers.

Then, in accordance with the methods of the invention, a thinning step is performed to remove at least all the material present above the top 72 of the substrate (FIG. 7B).

During the etch step, the variation in composition between some of the uneven (alternatively even) layers provides different etch kinetics between these layers. It is therefore possible to obtain a nano-imprint structure comprising thin patterns 5 separated by nano-trenches 6 of depth z(2i+1) that is variable relative to the level of the substrate (FIG. 7C). The final device is then formed of a substrate 2 comprising trenches 6 of widths e(2i+1), of variable depths z(2i+1), separated by patterns 5 in a second material.

Said variation in the level z(j) of the bottom of the nano-trenches 6 separating the patterns makes it possible to modify the free volume v(j)–(j+1) either side of each pattern 5(j) (FIG. 6C). Therefore there are free volumes sufficient to allow the flow of resin 100, present between the patterns 5 and substrate 200, to be homogeneous from one pattern 5(j) to another. It is therefore possible to influence the homogeneity of the residual thicknesses $t_j$ after pressing (FIG. 6C') such that they are equal to t. Therefore after removing the mould, the inhomogeneity of the thicknesses $t_j$ of the bottoms of the nan-trenches 50, formed by pressing the mould 300 into the resin 110, is minimized (FIG. 6D).

In one advantageous method according to this embodiment, the variations in stoichiometry between different layers 4(i) consisting of one same type of material are such that, after etching, the free volume 6 between two patterns 5 is optimized so as to minimize the non-homogeneity of the residual thicknesses $t_i$ when using the nano-imprint mould.

Should the patterns have a difference in level Z with the substrate (the case in FIG. 1C), the compositions of the layers 4(i) are such that the depths z(2i) of the nano-trenches are greater at the centre of the trenches 73 (or arrays 7 of patterns) than on the edge of these trenches or arrays. Further advantageously, the compositions of the layers 4(i) are such that the depths z(2i), after etching, increase from the edge as they extend towards the centre of the trenches 73 or towards the centre of an array of patterns on one of the sidewalls (for example in FIG. 3F, the region of width A is considered and not the total width A' of the material filling a whole trench 73).

Alternatively (the case in FIG. 1D), if the patterns are at the level of the substrate, the compositions of the layers 4(i) are such that the depths z(2i+1) of the nano-trenches, after etching, are greater on the edge of the trenches 73 (or arrays of patterns 7) than in the centre of these trenches or arrays. Even further advantageously, the compositions of the layers 4(i) are such that the depths z(2i+1), after etching, decrease from the edge as they extend towards the centre of the trenches 73 or arrays 7.

Figure 8A:
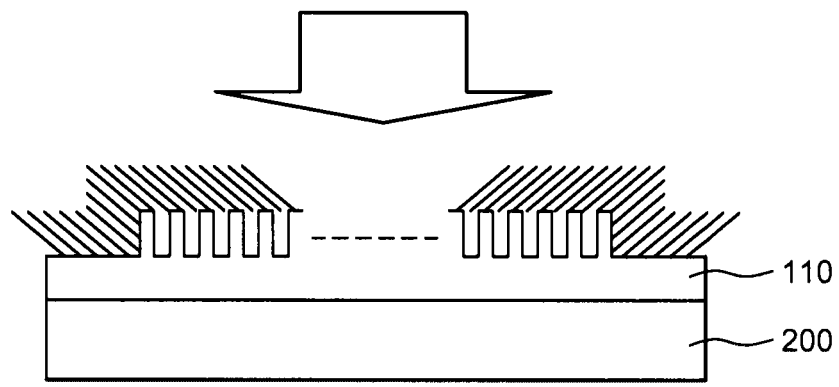
FIGS. 8A, 8B, 8C, 8D, 8E, and 8F are comparative examples of imprint shapes made in a resin, in relation to the mould used.
Figure 8B:
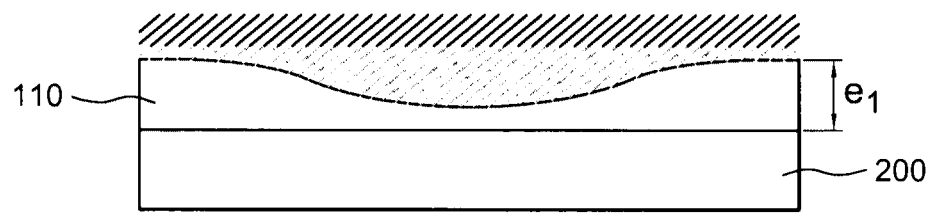
Figure 8C:
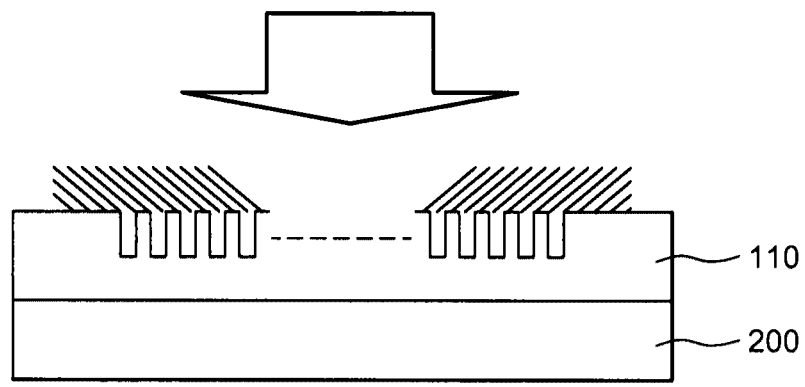
Figure 8D:
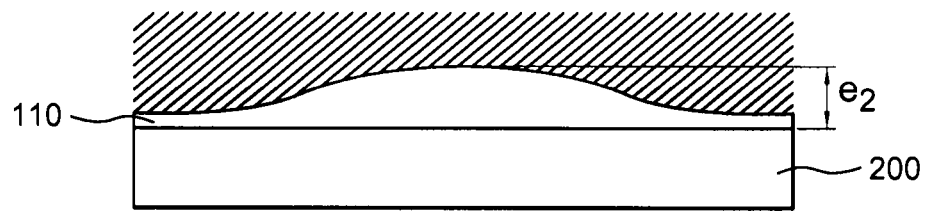
Figure 8E:
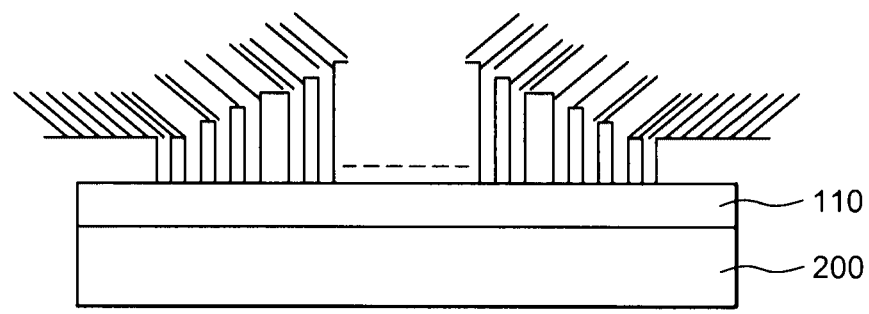
Figure 8F:
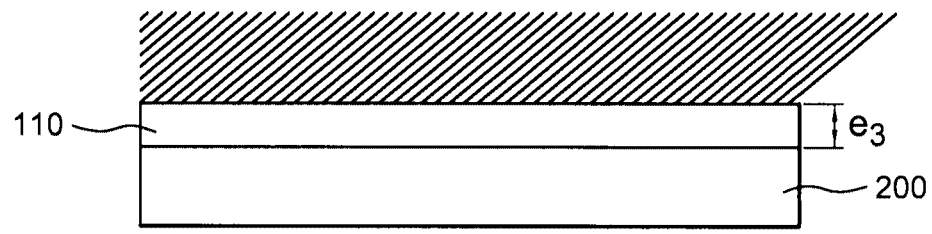

To optimize the local depths of the patterns, in particular the variation in depth between the patterns located in the centre of the array and those located on the edge, it is possible to proceed as follows as described with reference to FIGS. 8A-8F. FIGS. 8A, 8C, 8E each show a mould 300 above a layer of resin 110, itself arranged on a substrate 200, FIGS. 8B, 8D, 8F show the general shape of the resin after the mould has been pressed therein (the patterns formed in the resin are not illustrated, only its general shape is shown). The mould in FIG. 8A is of the type described above with reference to FIG. 1B, the mould in FIG. 8C is of the type described above with reference to FIG. 1A, and the mould in FIG. 8E is of the type described above with reference FIG. 1C. It is with this last mould that the resin 110 maintains its thickness $e_3$ uniform, even after pressing (FIG. 8F).

During an initial stage, first pressing in the resin 110 is made with a mould whose depths at all the teeth are identical i.e. a mould of the type shown FIG. 1A or FIG. 1C. This gives a certain imprint profile with a distribution of residual thickness $e_1$, $e_2$ (FIGS. 8B, 8D) that is measurable, for example using a technique such as SEM, or scatterometry, or AFM.

These measurements are used to determine the difference in height which must be obtained between different regions of the mould in order to homogenize imprinting and obtain a more homogeneous residual thickness.

For example, for the case in FIG. 8D the residual thickness $e_2$ is greater in the centre of the array, therefore a deeper mould is required at this point having an additional depth equal to the difference measured between the edge and the centre (if it is considered that the reference lies on the edge of the array).

By locally adjusting the available volume for the resin, this overcomes flows of resin over long distances, which take time with thermal imprinting.

In one method of the invention, the alternate layers 4(2i) (second material), during the step described in FIGS. 3G, 4E and 5F, preferably have etch kinetics of the same order as the substrate. This second material forming these layers can advantageously be the same as the material of the substrate.

The pair formed by the two materials which can be etched selectively and forming the alternate conforming layers 4(i) is advantageously the Si/SiGe pair, SiGe containing more than 15% Ge, with silicon oxide possibly limiting the deposit of the conforming layers 4(i) in Si and SiGe.

One material whose chemical composition can be adjusted from one layer to another is an alloy for example that is at least binary such as $Si_xGe_{1-x}$ or $Si_xC_{1-x}$ or $Si_xN_{1-x}$ or $SiC_xN_{1-x}$ or $Al_xGa_{1-x}As$. The deposit of said material is not necessarily monocrystalline: it may be amorphous which permits a multitude of alloys during the deposit steps.

For the present application an alloy is selected in relation to its capability to be etched with different speeds when the relative composition of each element is caused to vary.

For this purpose it is possible initially to make full wafer deposits with variable compositions i.e. different xs. Then, with one same etch chemistry, the etch speeds of the different compositions are determined. If the etch speed ratio between an alloy of given composition and the same alloy but of different composition is different from 1, then this alloy in these compositions can be used.

Reciprocally, the substrate in which the trenches 73 are formed can advantageously be chosen from one of the materials of the pair chosen to form the alternate conforming layers e.g. Si, SiGe or SiO2.

Examples of embodiment and use of the devices of the invention are given in FIGS. 9 to 12.

Figure 9:
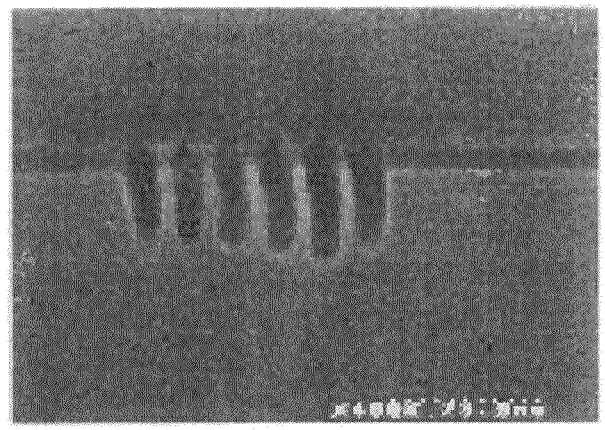
FIG. 9 illustrates a cross-section of a device obtained following one of the methods according to the invention, after the selective etching step.

A cross-section of a device as in FIG. 1A, obtained by applying one of the methods of the invention, in Si and SiGe, the bottom of the nano-trenches being in SiGe, is given FIG. 9, obtained by a scanning electronic microscope. The patterns (in Si) separated by nano-trenches (in SiGe) can be seen, the level of the top of the patterns being substantially equal to that of the substrate.

Figure 10:
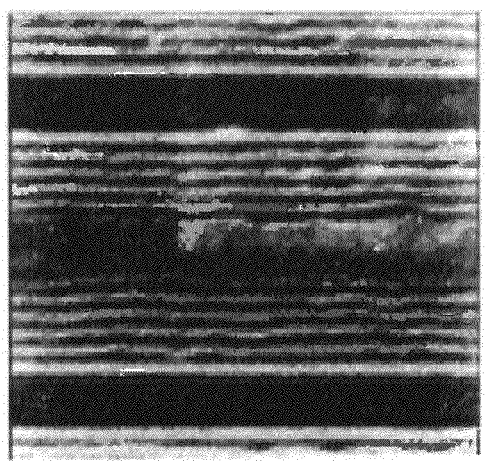
FIGS. 10 and 11 illustrate different results of methods according to the invention, respectively in a spiral-shaped trench and in trenches formed of an array of lines. The alternating patterns separated by nano-trenches then have a global design following the initial shape of the trench.
Figure 11:
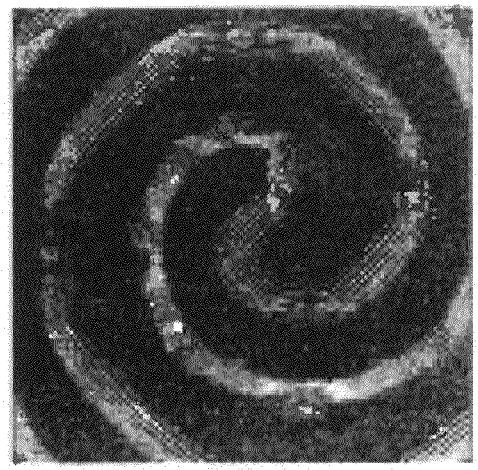

FIGS. 10 and 11 are images obtained by scanning electronic microscope from an overhead view, the plane of these two figures being the plane of the substrate (2) in FIG. 1A. These two figures illustrate different devices (also in Si for the first patterns and in SiGe for the second patterns) obtained using methods following the invention:

in FIG. 10 (image 8 μm×8 μm): a device with no filler material in the centre of the trench, in a spiral trench, thereby forming an array of patterns whose global design follows the initial shape of the trench, separated by nano-trenches;

in FIG. 11 (image 750 nm×750 nm): a second device of the invention, in which the trenches are in the form of an array of trenches. Since the trenches are not fully filled with the alternate layers, there are two arrays of patterns in each trench separated by a thickness in filler material. The patterns obtained have a width of 10 nm and are separated by nano-trenches of width 10 nm.

Figure 12:
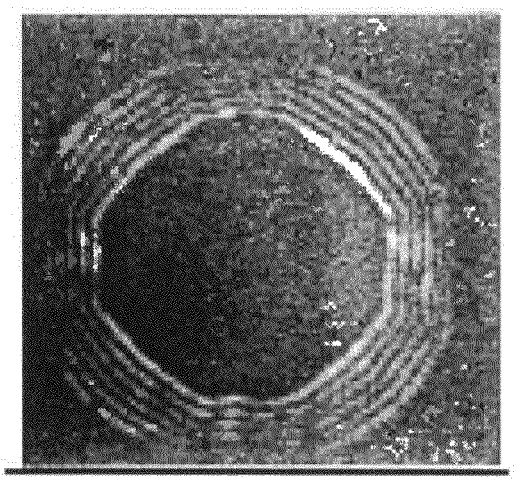
FIG. 12 illustrates the result obtained on a deformable layer after use of a Nano-imprint mould obtained following the invention and comprising a circular trench.

FIG. 12 (image 1 μm×1 μm) shows the topology obtained on a malleable layer after pressing a nano-imprint mould into a resin, then releasing the mould, the mould being fabricated according to the invention and the trench, in which the patterns of the invention were made, being circular.

These patterns can be obtained by forming facets, each one being straight; this is the case when a crystalline material is used that is scarcely suitable for forming curves. If an amorphous material is used, any shape can be obtained including curved (which is the case in FIG. 12 for example).

In general, the selectivity of one material relative to another relates to chemical or physical etching or chemically assisted etching. It is possible for example to obtain information on the behaviours of materials under different types of etching in:

Handbook of Plasma Processing Technology: Fundamentals, Etching, Deposition, and Surface Interactions (Materials Science and Process Technology), Stephen M. Rossnagel et al. Noyes Publications (Jan. 1, 1990) ISBN-10: 0815512201; ISBN-13: 978-0815512202;

Physics of Semiconductor Devices by Simon M. Sze, Wiley-Interscience; 2nd Edition (September 1981), ISBN-10: 0471056618, ISBN-13: 978-0471056614;

Plasma etching and reactive ion etching (American Vacuum Society monograph series) by J. W Coburn, American Institute of Physics (1982) ISBN-10: 0883184060; ISBN-13: 978-0883184066.

The invention claimed is:

1. A method to fabricate an imprint mould in three dimensions comprising at least:
   a) forming at least one trench, of width W and depth h, in a substrate, thereby forming three surfaces including,
      a bottom of the at least one trench,
      sidewalls of the at least one trench, and a remaining surface of the substrate, called top of the substrate, b) forming alternate layers in the at least one trench, each having at least one portion perpendicular to the substrate, in a first material and in a second material which can be selectively etched relative to the first material, the at least one trench also including a third material limiting or inhibiting deposit of alternate layers formed on the top of the substrate, the alternate layers then being deposited solely in the at least one trench, thinning being performed subsequently so as to expose a field of the substrate, and c) selectively etching said portions of the layers perpendicular to the substrate, thereby forming a topology including at least, first patterns whose top lies at a first level relative to a surface of the substrate, located either side of said topology, these first patterns being in a first material, and second patterns having at least a second level relative to said surface of the substrate, different from and lower than the first level, these second patterns being in a second material.

2. The method according to claim 1, wherein the selective etching includes etching at least part of the substrate and either side of the topology, and the first patterns then protruding relative to the surface of the substrate.

3. The method according to claim 1, wherein the selective etching includes etching the second material, the top of the first patterns, after the selective etching, lying at a level substantially equal to the level of the surface of the substrate.

4. The method according to claim 1, wherein before the step c), the method comprises anisotropic etching of the first and second material, and then selective etching of the second material, and the top of the first patterns after selective etching being at a lower level than the level of the surface of the substrate.

5. The method according to claim 1, wherein the step b) comprises forming the alternate layers in the at least one trench, solely perpendicular to the substrate and to the bottom of the at least one trench.

6. The method according to claim 5, wherein a material limiting or inhibiting the formation of alternate layers on the bottom of the substrate is formed at the bottom of the at least one trench.

7. The method according to claim 5, wherein the substrate is SOI, comprising a surface layer of semiconductor material, a buried insulator layer and a carrier substrate, one portion of said buried insulator layer forming a layer of the material limiting or inhibiting the formation of alternate layers on a bottom of the substrate at the bottom of the at least one trench, and is obtained by etching said surface layer as far as the buried insulator layer.

8. The method according to claim 1, wherein the step b) comprises forming, in the at least one trench, the alternate layers partly perpendicular to the substrate and to the bottom of the at least one trench and partly parallel to a surface of the bottom of the at least one trench.

9. The method according to claim 1, further comprising forming of said alternate layers on the top of the substrate, these layers then being deposited at least following the sidewalls of the at least one trench and around each trench, on the field of the substrate, thinning then being performed subsequently to expose the field of the substrate.

10. The method according to claim 1, wherein the thinning is conducted by at least one of mechanical chemical polishing or grinding.

11. The method according to claim 1, wherein the at least one trench is not fully filled with the alternate layers, thereby leaving a residual trench portion to subsist, and the method includes depositing a filler material at least in this residual trench portion.

12. The method according to claim 1, wherein the selective etching is partial etching of the second material, and a bottom of the second patterns is the second material remaining after the partial etching.

13. The method according to claim 1, wherein the first material is Si and the second material is SiGex with x>15%.

14. A method to fabricate an imprint mould in three dimensions comprising at least:

a) forming at least one trench, of width W and depth h, in a substrate, thereby forming three surfaces including,
a bottom of the at least one trench,
sidewalls of the at least one trench, and
a remaining surface of the substrate, called top of the substrate, b) forming alternate layers in the at least one trench, each having at least one portion perpendicular to the substrate, in a first material and in a second material which can be selectively etched relative to the first material, c) selectively etching said portions of the layers perpendicular to the substrate, thereby forming a topology including at least,
first patterns whose top lies at a first level relative to a surface of the substrate, located either side of said topology, these first patterns being in a first material, and
second patterns having at least a second level relative to said surface of the substrate, different from and lower than the first level, these second patterns being in a second material, the second patterns being in a material having a difference in etch speed from one second pattern to another which, after etching, results in the formation of second patterns with at least two different levels, and the difference in etch speed between at least two layers of the second patterns being obtained by a difference in composition of material between at least the two layers of the second patterns.

* * * * *